United States Patent
Sumino et al.

(10) Patent No.: US 7,268,056 B2
(45) Date of Patent: Sep. 11, 2007

(54) METHOD OF FABRICATING A SEMICONDUCTOR DEVICE WITH A TRENCH ISOLATION STRUCTURE AND RESULTING SEMICONDUCTOR DEVICE

(75) Inventors: Jun Sumino, Hyogo (JP); Satoshi Shimizu, Hyogo (JP); Tsuyoshi Sugihara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/033,322

(22) Filed: Jan. 12, 2005

(65) Prior Publication Data
US 2005/0124107 A1    Jun. 9, 2005

Related U.S. Application Data

(63) Continuation of application No. 10/136,404, filed on May 2, 2002, now Pat. No. 6,849,919.

(30) Foreign Application Priority Data

Aug. 13, 2001 (JP) ............................. 2001-245209

(51) Int. Cl.
*H01L 21/76* (2006.01)
(52) U.S. Cl. .................. 438/427; 438/424; 257/506; 257/510; 257/E21.179
(58) Field of Classification Search .................. None
See application file for complete search history.

(56) References Cited

U.S. PATENT DOCUMENTS

| | | | |
|---|---|---|---|
| 4,472,240 A | 9/1984 | Kameyama | |
| 4,495,025 A | 1/1985 | Haskell | |
| 5,895,253 A | 4/1999 | Akram | |
| 6,034,409 A | 3/2000 | Sakai et al. | |
| 6,137,152 A | 10/2000 | Wu | |
| 6,165,871 A | 12/2000 | Lim et al. | |
| 6,175,144 B1 | 1/2001 | Gardner et al. | |
| 6,177,317 B1 | 1/2001 | Huang et al. | |
| 6,207,532 B1 | 3/2001 | Lin et al. | |
| 6,242,788 B1 | 6/2001 | Mizuo | |
| 6,319,795 B1 | 11/2001 | Liu | |
| 6,383,877 B1 * | 5/2002 | Ahn et al. | 438/296 |
| 2005/0139951 A1 | 6/2005 | Pyi | |

FOREIGN PATENT DOCUMENTS

JP             58-31531        2/1983

(Continued)

*Primary Examiner*—Michael Lebentritt
*Assistant Examiner*—Cheung Lee
(74) *Attorney, Agent, or Firm*—McDermott Will & Emery LLP

(57) ABSTRACT

The present fabrication method includes the steps of: providing a nitride film in a main surface of a semiconductor substrate; providing an upper trench, with the nitride film used as a mask; filling the upper trench with an oxide film introduced therein; removing the oxide film to expose at least a portion of a bottom of the upper trench and allowing a remainder of the oxide film to serve as a sidewall; providing a lower trench in a bottom of the upper trench, with the sidewall used as a mask; and with the upper trench having the sidewall remaining therein, providing an oxide film in the upper trench and the lower trench. This can provide a semiconductor device fabrication method and a semiconductor device preventing a contact from penetrating the device in an interconnection process.

4 Claims, 10 Drawing Sheets

FOREIGN PATENT DOCUMENTS

| | | |
|---|---|---|
| JP | 58-32430 | 2/1983 |
| JP | 63-115348 | 5/1988 |
| JP | 11-74339 | 3/1999 |
| KR | 2001-4277 | 1/2001 |
| KR | 2001-8601 | 2/2001 |
| KR | 2001-36818 | 5/2001 |

* cited by examiner

METHOD OF FABRICATING A SEMICONDUCTOR DEVICE WITH A TRENCH ISOLATION STRUCTURE AND RESULTING SEMICONDUCTOR DEVICE

CROSS-REFERENCE TO RELATED APPLICATIONS

This application is a continuation of application Ser. No. 10/136,404 filed May 2, 2002 now U.S. Pat. No 6,849,919.

BACKGROUND OF THE INVENTION

1. Field of the Invention

The present invention relates generally to semiconductor device fabrication methods and semiconductor devices, and more specifically to methods of fabricating semiconductor devices having a trench isolation structure isolating elements of the semiconductor device, and semiconductor devices.

2. Description of the Background Art

A shallow trench isolation (STI) structure is generally used as a structure isolating elements of a semiconductor device. In this STI structure a trench is formed in a main surface of a semiconductor substrate and it then internally has oxide film buried therein to provide electrical insulation between adjacent elements.

When this STI structure is applied to a conventional semiconductor device it has a trench having a geometry closer to a rectangle and having a sidewall and a bottom surface together forming a substantially right angle, since in recent years semiconductor devices are required to be micro-fabricated an element isolation is accordingly required to be more micro-fabricated. As such the trench would have a steep sidewall and in an interconnection process when a contact is made with an active region adjacent to the trench a mask can be misregistered or the contact may have a variation in diameter and a trench isolation film can be removed. Furthermore, if the trench isolation film can be removed significantly, the contact can reach a semiconductor substrate region underlying the isolation film and thus have a significant effect on electrical characteristics.

Furthermore the STI structure often has a trench with an internal wall nitrided or provided with nitride film to prevent a junction from having significant defective leakage of electricity resulting from stress concentration introduced at a corner formed by the trench's sidewall and bottom surface that is attributed to a thermal history in a process for fabricating a semiconductor device. To prevent this, the trench has an internal wall nitrided or provided with nitride film to alleviate stress.

If a trench has an internal wall nitrided or provided with nitride film to prevent a junction from having significant defective leakage of electricity, however, an oxide film close to a portion serving as a gate oxide film would also be nitrided or after a gate oxide film is formed a nitride film would exist closer thereto and as a result an electron is trapped and electrical characteristics are thus impaired. This is significantly observed particularly when the STI structure is applied to a non-volatile semiconductor device, and it may result in a reduced yield and have a significantly negative effect on the reliability of the product. Thus there is a demand for a trench isolation structure capable of preventing a junction from having defective leakage of electricity, and also capable of ensuring a reliable gate oxide film.

SUMMARY OF THE INVENTION

The present invention has been made to overcome the disadvantage described above and it contemplates a semiconductor device fabrication method and a semiconductor device capable of preventing a contact from penetrating the device in an interconnection process, of enhancing a property preventing a junction from having defective leakage of electricity, and also of ensuring a reliable gate oxide film.

The present invention provides a method of fabricating a semiconductor device, including the steps of: providing a first stopper film on a main surface of a semiconductor substrate; with the first stopper film used as a mask, providing a first recess in a main surface of the semiconductor substrate; filling the first recess with a first insulation film; removing the first insulation film in the first recess to expose at least a portion of a surface of the semiconductor substrate defining a bottom of the first recess, and allowing a remainder of the first insulation film to serve as a second stopper film; with the second stopper film used as a mask, providing a second recess in a surface of the semiconductor substrate defining a bottom of the first recess; and with the first recess having the second stopper film remaining therein, providing a second insulation film in the first recess and the second recess.

In the present method the step of removing the second stopper film to homogenize an isolation film, as conventional, can be dispensed with to simplify the fabrication process. Since the stopper film is not removed, the recess can have a sidewall gentle in geometry to avoid stress concentration for example in a thermal treatment to prevent a junction from having significant leakage of electricity. Furthermore, with the recess having the gentle sidewall, if a contact is misaligned in an interconnection process the contact and the substrate can avoid short circuit and an increased yield can thus be achieved. Note that in the present method the second insulation film desirably fills the first and second recesses.

Desirably the present method for example further includes the steps of: providing a layer of a nitride film to cover a surface of the second insulation film provided in the first recess and the second recess; and providing a third insulation film on the nitride film to fill the first recess and the second recess.

In the present method a nitride film can enhance a property preventing a junction from having significant leakage of electricity and furthermore between the nitride film, and an adjacent element region and a gate oxide film provided on the element region there exists a thick, first insulation film to maintain a distance between the nitride film and the gate oxide film so as to prevent electron-trapping and thus enhance the gate oxide film in reliability. Note that in the present method the third insulation film desirably fills the first and second recesses.

For example if the semiconductor device is a non-volatile semiconductor memory device the present method may further includes the steps of: depositing an oxide film on a main surface of the semiconductor substrate to provide a tunnel oxide film; and after providing the second insulation film, providing a polysilicon layer on the tunnel oxide film to provide a floating gate.

When the present method is used to fabricate a non-volatile semiconductor memory device, it can micorfabricate a tunnel oxide film while maintaining the effect of preventing a short circuit introduced when a contact is misaligned. The microfabrication of the tunnel oxide film can improve a coupling ratio and thus enhance the performance of the non-volatile semiconductor device.

The present invention provides a semiconductor device including: a first recess provided in a main surface of a semiconductor substrate; a second recess provided in a surface of the semiconductor substrate defining a bottom of the first recess; a first insulation film covering a surface of the semiconductor substrate defining the first recess; and a second insulation film provided in a step different than the first insulation film, to continuously cover a surface of the first insulation film and a surface of the semiconductor substrate defining the second recess.

The present configuration can prevent a contact from penetrating the device to reach a semiconductor substrate when misalignment is introduced in the interconnection process described above.

For example the present semiconductor device desirably includes: a nitride film provided in a surface of the second insulation film in the first recess and the second recess; and a third insulation film covering a surface of the nitride film.

The present configuration can effectively prevent a contact from penetrating the device to reach a semiconductor substrate, as described above, and can also enhance a gate oxide film in reliability when the present configuration is applied to a non-volatile semiconductor device.

For example if the semiconductor device is a non-volatile semiconductor device, it also includes a tunnel oxide film positioned on an active region of the semiconductor substrate adjacent to the first recess; and a floating gate positioned on the tunnel oxide film.

The present configuration can provide a non-volatile semiconductor memory device effectively preventing a contact from penetrating the device to reach a semiconductor substrate, and in addition thereto providing a coupling ratio better than conventional.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A first embodiment of the present invention will now be described with reference to the drawings.

Method of Fabricating a Semiconductor Device

Figure 1A:
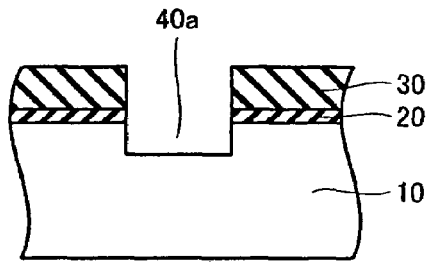
FIGS. 1A-1G are cross sections for illustrating a method of fabricating a semiconductor device in a first embodiment of the present invention.

Reference will initially be made to FIGS. 1A-1G to describe a method of fabricating a semiconductor device in a first embodiment of the present invention. Initially a semiconductor substrate 10 is provided with a pad oxide film 20 on a main surface thereof in order to deposit a nitride film 30 serving as a first stopper film on the main surface of semiconductor substrate 10. Then pad oxide film 20 has nitride film 30 deposited thereon and photolithography is employed to remove nitride film 30 and pad oxide film 20 to expose a main surface of semiconductor substrate 10 corresponding to a region used to form an element isolation structure. Then nitride film 30 remaining on a main surface of semiconductor substrate 10 is used as a mask to dry-etch semiconductor substrate 10 to form a first recess serving as an upper trench 40a (FIG. 1A).

Figure 1E:
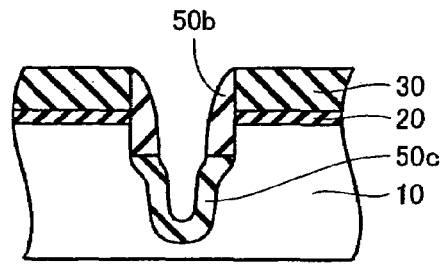
Figure 1B:
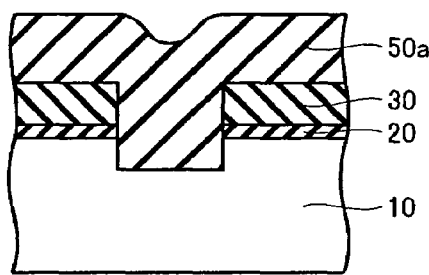

Then an insulation film 50a is deposited and thus buried in upper trench 40a (FIG. 1B). Buried insulation film 50a may be any insulation film, such as film formed by using tetraethoxysilane (TEOS), non-doped silicate glass (NSG) film, and the like. Buried insulation film 50a is etched to partially remain to form a sidewall 50b serving as a second stopper film (FIG. 1C). Since sidewall 50b serves as a mask used to form another trench in a bottom of upper trench 40*a*, a condition needs to be set to expose a predetermined portion of the bottom of upper trench 40*a*. Then, sidewall 50*b* is used as a mask to etch a surface of semiconductor substrate 10 defining a bottom of upper trench 40*a* and thus form a second recess serving as a lower trench 40*b* (FIG. 1D).

Conventionally, sidewall 50*b* is then removed to allow an insulation film to be uniform. In the present embodiment, sidewall 50*b* is not removed and lower trench 40*b* then has an internal wall oxidized. The oxidization of the internal wall is only required to have a thickness simply covering a surface of lower trench 40*b* and it is generally provided to enhance a property preventing a junction from having electrical leakage. The oxidization of the internal wall allows lower trench 40*b* to have a sidewall and a bottom surface provided with an internal wall oxide film 50*c* serving as a second insulation film (FIG. 1E).

Figure 1F:
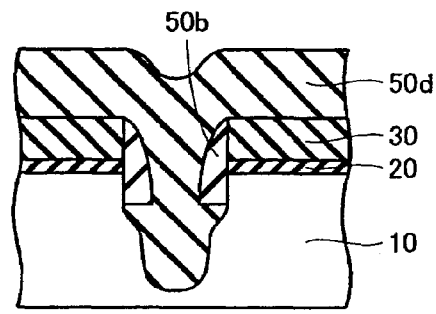
Figure 1C:
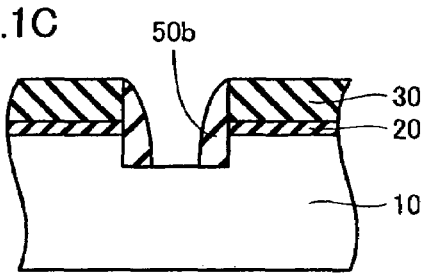
Figure 1G:
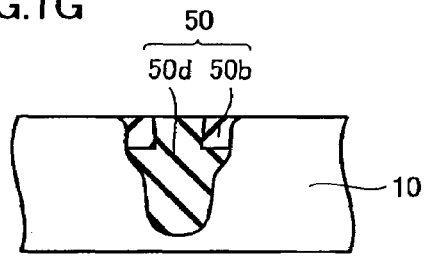
Figure 1D:
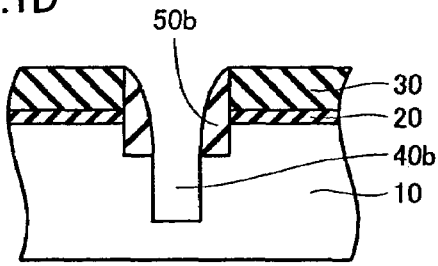

Then TEOS is again used to provide an oxide film 50*d* filling a trench defined by sidewall 50*b* and internal wall oxide film 50*c* (FIG. 1F). In doing so, upper and lower trenches 40*a* and 40*b* are completely filled. Then the intermediate product is chemically, mechanically polished for planarization to expose nitride film 30, and nitride film 30 and oxide film 20 are etched away (FIG. 1G).

Figure 2:
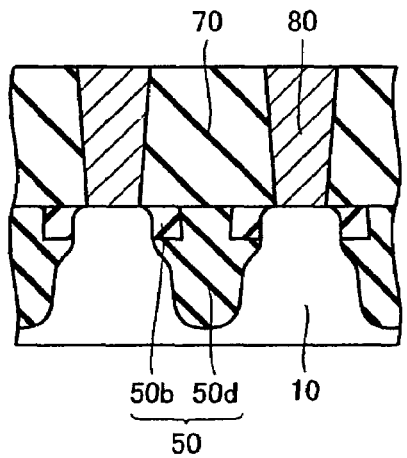
FIG. 2 is a cross section for illustrating a structure of the semiconductor device in the first embodiment.

Thus semiconductor substrate 10 has a main surface provided with a 2-step trench isolation film 50 isolating adjacent elements from each other. Thereafter, an element is fabricated and an interconnection is provided to complete a semiconductor device, as shown in FIG. 2. Although not shown in the figure, the trench isolation film is provided and then a gate oxide film (not shown), an element and the like are successively formed before the interconnection is provided. In the interconnection process typically an interlayer insulation film 70 is deposited on a surface of a semiconductor element, a predetermined portion of interlayer insulation film 70 is removed and then filled with conductor to provide a contact 80 effecting electrical extraction of the element.

Structure of Semiconductor Device

Reference will now be made to FIG. 2 to describe a structure of a semiconductor device fabricated in the method described above. Semiconductor substrate 10 has a main surface provided with an element region and an element isolation region alternately. The element isolation region is 2-step trench isolation film 50 formed in the process as described above, and its upper portion, or the upper trench, has opposite ends formed of insulation film 50*b* having a sidewall structure and the remaining, internal portion of the trench is filled with internal wall oxide film 50*c* (not shown in the figure) and buried oxide film 50*d*. Each oxide film in insulation film 50 can have a structure clearly distinguished by processing it with an agent using for example hydrogen fluoride (HF). Furthermore, trench isolation film 50 is covered by interlayer insulation film 70 described above and on the element region, contact 80 is provided for electrical extraction of the element.

Function and Effect

A semiconductor device with a trench isolation film thus structured can be effective, as follows: first, it can be fabricated in a simplified process as a sidewall is not removed to homogenize an isolation film, as conventional. Furthermore, the trench insulation film can have a sidewall gentle in geometry to avoid stress concentration introduced for example in a thermal treatment and thus prevent a junction from having a significant leakage of electricity. This can provide a semiconductor device having satisfactory withstand voltage and electricity leakage prevention characteristics.

Figure 3A:
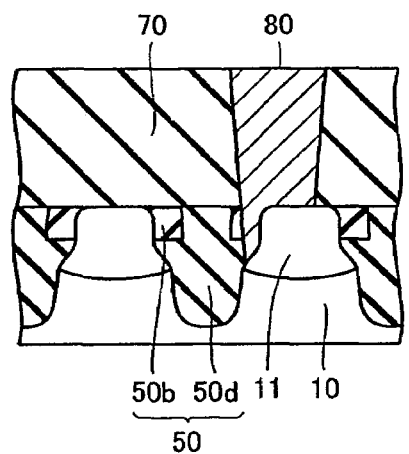
FIG. 3A is a cross section for illustrating an effect when the semiconductor device of the first embodiment has misalignment.
Figure 3B:
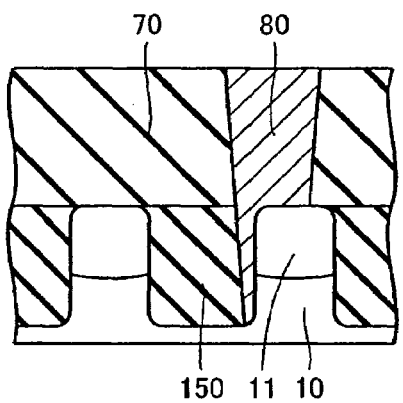
FIG. 3B is a cross section of a conventional semiconductor device having a misalignment.

Furthermore, with reference to FIG. 3A, if a mask for forming contact 80 is misaligned in an interconnection process, trench isolation film 50 having a sidewall gentle in geometry can prevent contact 80, by forming diffusion layer 11 in semiconductor substrate 10 at a region adjacent to trench isolation film 50 to extend from a main surface of a semiconductor substrate 10 depthwise to reach a location deeper than a first recess and also be in contact with a side surface of a second recess, penetrating trench isolation film 50 and thus reaching semiconductor substrate 10 thereunder. This can prevent short circuit of contact 80 and semiconductor substrate 10 and thus increase yield. FIG. 3B shows a semiconductor device having a conventional trench isolation film 150 with contact 80 misaligned. Since trench isolation film 150 has a steep sidewall, even a slight misalignment immediately results in defective short circuit.

Figure 4A:
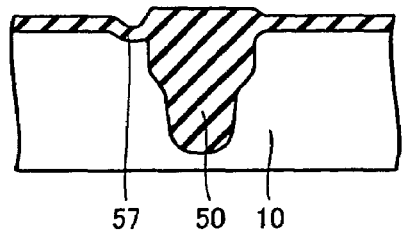
FIG. 4A is a cross section of the semiconductor device of the first embodiment with an isolation film having an end abnormal in geometry.
Figure 4B:
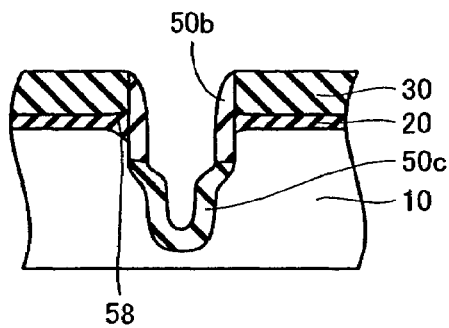
FIG. 4B is a cross section of the semiconductor device after the geometrical abnormality is repaired.

If in a main surface of a semiconductor substrate an isolation film has an end, or a bird's beak, having an abnormal geometry, as shown in FIG. 4A, the abnormal geometry can induce a thinning of a gate oxide film and thus result in the gate oxide film having an abnormal geometry. If the abnormal geometry is introduced, conventionally a semiconductor substrate surface corresponding to the portion of interest is oxidized in the step of oxidizing an internal wall, to grow the bird's beak to repair the abnormal geometry. In the present invention, the internal wall is oxidized with sidewall 50*b* remaining and the abnormal geometry is thus not repaired and seems to result in a reduced yield. In effect, however, controlling sidewall 50*b* to remain to have a thickness of several tens to several hundreds A allows the semiconductor substrate surface of the geometrically abnormal portion 57 to be oxidized through sidewall 50*b* to grow a bird's beak 58 (FIG. 4B) to prevent reduction in yield.

Figure 5A:
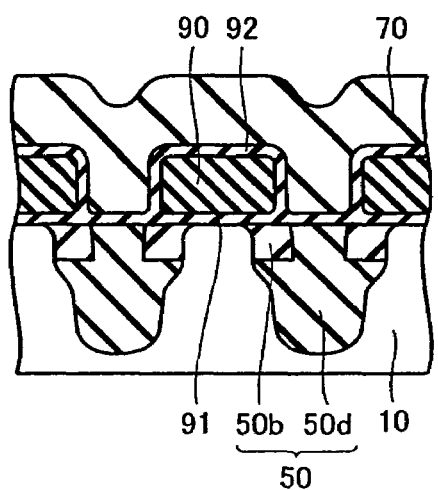
FIG. 5A is a cross section for illustrating an effect achieved when the method of the first embodiment is applied to a non-volatile semiconductor memory device.
Figure 5B:
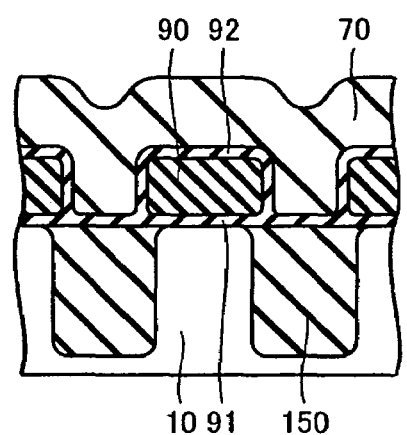
FIG. 5B is a cross section for illustrating a structure of a conventional, non-volatile semiconductor memory device.

Furthermore, as shown in FIG. 5A, if the present invention is applied to a non-volatile semiconductor memory device, it can have an element structure microfabricated while it still can effectively prevent short circuit introduced when contact 80 is misaligned, as has been described previously. This microfabrication can improve a coupling ratio to provide the non-volatile semiconductor memory device with satisfactory electrical characteristics. The coupling ratio represents a ratio between a capacity of an oxide nitride oxide (ONO) film 92 overlying a floating gate 90 and that of a tunnel oxide film 91 underlying floating gate 90 and it is known that if this ratio is larger the non-volatile semiconductor memory device is enhanced in performance. Note that FIG. 5B is a cross section for reference, showing a non-volatile semiconductor memory device using a conventional trench isolation film.

Second Embodiment

A second embodiment of the present invention will now be described with reference FIGS. 6A-6E. Note that in the present embodiment the present invention is applied to a non-volatile semiconductor memory device.

Method of Fabricating a Non-volatile Semiconductor Device

Figure 6A:
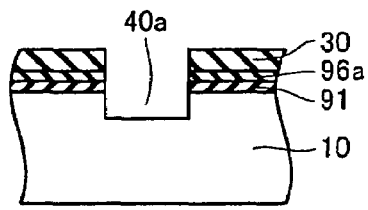
FIGS. 6A-6E are cross sections for illustrating a method of fabricating a non-volatile semiconductor memory device in a second embodiment of the present invention.

Initially on a main surface of semiconductor substrate 10 is deposited a tunnel oxide film 91 also serving as a pad oxide film for depositing nitride film 30 serving as a first stopper film. Then on tunnel oxide film 91 a polysilicon layer 96*a* is provided and thereon nitride film 30 is further deposited. Photolithography is then employed to remove nitride film 30, polysilicon layer 96a and tunnel oxide film 91 to expose a main surface of semiconductor substrate 10 corresponding to a region used to an element isolation structure. Subsequently, nitride film 30 remaining on a main surface of semiconductor substrate 10 is used as a mask to etch semiconductor substrate 10 to form a first recess serving as an upper trench 40a (FIG. 6A).

Figure 6B:
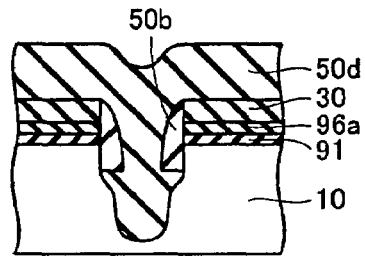
Figure 6C:
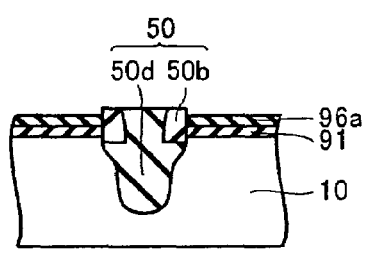

Then, an insulation film 50a is introduced, as described in the first embodiment, and etched to leave a sidewall 50b serving as a second stopper film in a portion of upper trench 40a. Furthermore, sidewall 50b is used as a mask to form a lower trench 40b, and trench 40 then has an internal wall thereof oxidized and it is then filled with an oxide film 50d introduced therein (FIG. 6B). The intermediate product is then chemically mechanically polished to remove nitride film 30 to obtain the structure shown in FIG. 6C.

Figure 6D:
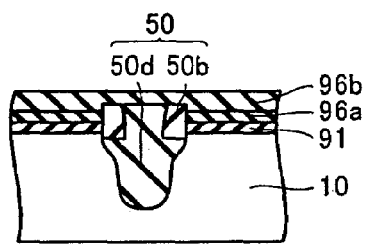
Figure 6E:
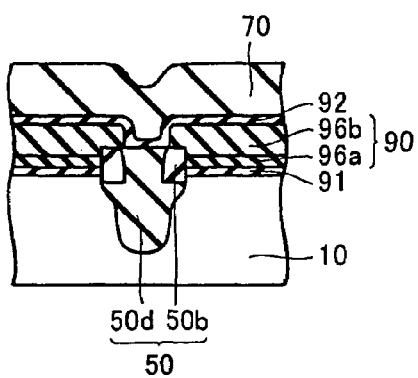

In the present embodiment a polysilicon layer 96b is further provided on isolation film 50 and polysilicon layer 96a exposed (FIG. 6D). Then, polysilicon layers 96a and 96b are patterned, ONO film 92 is provided and a control gate is provided to obtain a non-volatile semiconductor memory device having the structure shown in FIG. 6E.

Function and Effect

Employing the method as described above to fabricate a non-volatile semiconductor memory device has the following effects: first, as has been described in the first embodiment, the sidewall removal step can be eliminated to reduce the number of process steps. Second, if a contact is misaligned in an interconnection process, short circuit of the contact and a semiconductor substrate can be prevented and yield can thus be increased. Furthermore, the coupling ratio can be improved and the non-volatile semiconductor memory device can thus have satisfactory electrical characteristics. In addition, the degree of freedom of the concentration profile of a floating gate, can be increased. This allows the floating gate to be formed of two polysilicon layers doped with different amounts of dopant and depending on the combination of the polysilicon layers four different combinations can be provided. Thus the degree of freedom in designing the concentration profile of the floating gate can be increased to contribute to improving the device's in electrical characteristics.

Third Embodiment

Figure 7A:
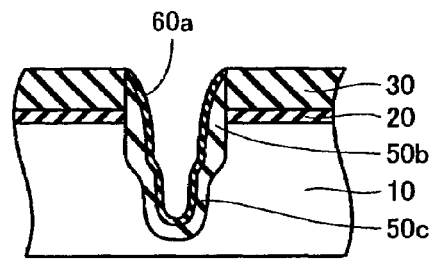
FIG. 7A is a cross section for illustrating a structure of a semiconductor device in a third embodiment of the present invention after it is nitrided.
Figure 7B:
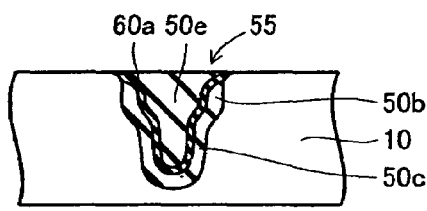
FIG. 7B is a cross section for illustrating a structure thereof after an interconnection process.

Reference will now be made to FIGS. 7A and 7B to describe a method of fabricating a semiconductor device in a third embodiment of the present invention and a structure thereof. The method in the present embodiment also follows the FIGS. 1A-1E steps described in the first embodiment. Then, nitride ion is introduced into an exposed surface of sidewall 50b and that of internal wall oxide film 50c to provide a nitrification 60a (FIG. 7A). Preferably, nitrification 60a has a thickness of approximately 1-40 Å. An oxide film 50e is then buried to provide a flat surface to form a semiconductor device having a trench isolation film 55 having the structure shown in FIG. 7B.

The present structure can achieve the effect of the first embodiment and in addition enhance a property preventing a junction from having electrical leakage more than a conventional fabrication method while maintaining the reliability of a gate oxide film, since nitrification 60a is spaced by sidewall 50b from an active region adjacent to trench isolation film 55 and pad oxide film 20 provided to serve as a gate oxide film provided on the active region.

Fourth Embodiment

Figure 8A:
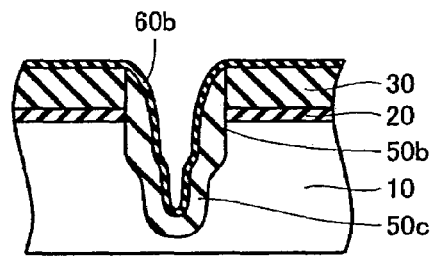
FIG. 8A is a cross section for illustrating a structure of a semiconductor device in a fourth embodiment of the present invention after it is provided with nitride film.
Figure 8B:
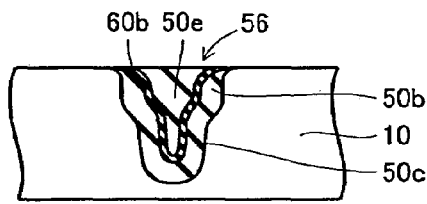
FIG. 8B is a cross section for illustrating a structure thereof after an interconnection process.

Reference will now be made to FIGS. 8A and 8B to describe a method of fabricating a semiconductor device in a fourth embodiment of the present invention and a structure thereof. The method of the present embodiment follows the FIGS. 1A-1E steps described in the first embodiment. Then, a nitride film 60b is deposited through chemical vapor deposition (CVD) on an exposed surface of sidewall 50b and that of internal wall oxide film 50c (FIG. 8A). The nitride film 60b preferably has a thickness of several tens to several hundreds Å. Then, oxide film 50e is buried to provide a flat surface to form a semiconductor substrate having a trench isolation film 56 having the structure shown in FIG. 8B.

The present structure, as well as that in the third embodiment, can achieve the effect of the first embodiment, and also enhance a property preventing a junction from having significant leakage of electricity while it can maintain the reliability of a gate oxide film.

Fifth Embodiment

Figure 9A:
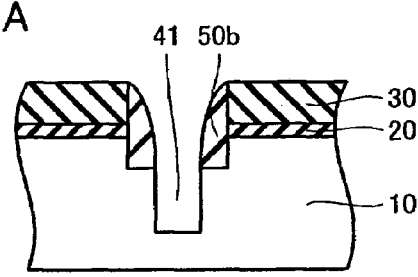
FIG. 9A is a cross section for illustrating a structure of a semiconductor device in a fifth embodiment of the present invention after it is provided with a trench.
Figure 9B:
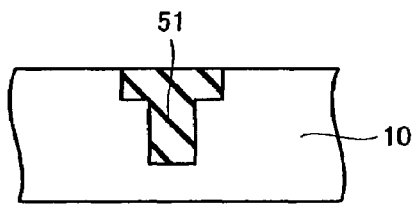
FIG. 9B is a cross section for illustrating a structure thereof after an interconnection process.

Reference will now be made to FIGS. 9A and 9B to describe a method of fabricating a semiconductor device in a fifth embodiment of the present invention and a structure thereof. The method of the present embodiment corresponds to that of the first embodiment minus an internal-wall oxidization step that should be provided after the FIG. 9A lower-trench formation step, and trench 41 almost rectangular in geometry receives an oxide film introduced therein to form a trench isolation film 51 having an almost rectangular, upper trench isolation film and a lower trench isolation film, as shown in FIG. 9B.

Although the present structure facilitates stress concentration in a thermal treatment, the step of removing a sidewall and that of removing an internal-wall oxide film can be eliminated to significantly simplify the fabrication process. The present embodiment is also as effective as the first embodiment as it can also prevent a contact from penetrating the device and improve the coupling ratio whine it is applied to a non-volatile semiconductor device.

Sixth Embodiment

Figure 10A:
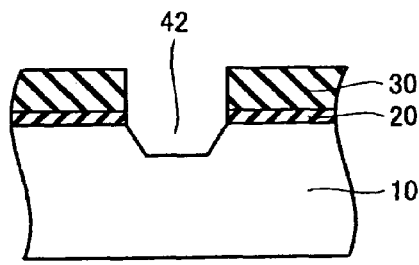
FIG. 10A is a cross section for illustrating a structure of a semiconductor device in a sixth embodiment of present invention after it is provided with an upper trench.
Figure 10B:
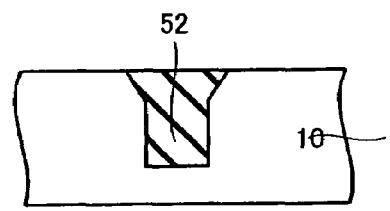
FIG. 10B is a cross section for illustrating a structure thereof after an interconnection process.

Reference will now be made to FIGS. 10A and 10B to describe a method of fabricating a semiconductor device in a sixth embodiment of the present invention and a structure thereof. In the present embodiment, an upper trench is formed, as described in the first embodiment at the step of forming the same, although it is formed by etching a semiconductor substrate to present a plane orientation thereof or etching it to allow the trench to have an oblique wall surface to form an upper trench 42 (FIG. 10A). The subsequent steps are similar to those of the first embodiment and a trench isolation film 52, as shown in FIG. 10B, is thus obtained.

The present structure can achieve an effect similar to that of the first embodiment. Furthermore, the trench can have a further gentle sidewall to prevent a junction from having defective leakage of electricity attributed to stress concentration.

Seventh Embodiment

Figure 11A:
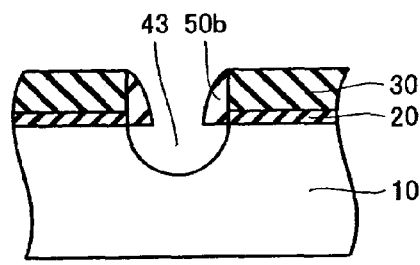
FIG. 11A is a cross section for illustrating a structure of a semiconductor device in a seventh embodiment of present invention after it is provided with an upper trench.
Figure 11B:
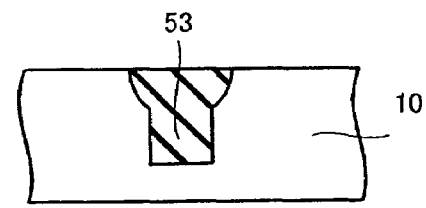
FIG. 11B is a cross section for illustrating a structure thereof after an interconnection process.

Reference will now be made to FIGS. 11A and 11B to describe a method of fabricating a semiconductor device in a seventh embodiment of the present invention and a structure thereof. In the present embodiment, an upper trench is formed, as described in the first embodiment at the step of forming the same, although isotropic-etching is employed to form an upper trench 43 (FIG. 11A). The subsequent steps are similar to those of the first embodiment and a trench isolation film 53, as shown in FIG. 11B, is thus obtained.

The present structure can achieve an effect similar to that of the first embodiment and furthermore provide a trench with a further gentle sidewall to prevent a junction from having defective leakage of electricity attributed to stress concentration.

Eighth Embodiment

Figure 12A:
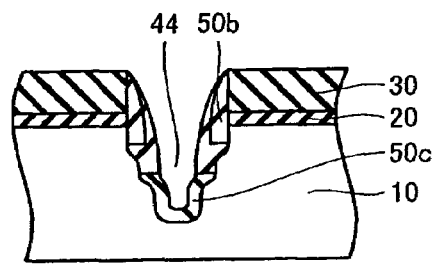
FIG. 12A is a cross section for illustrating a structure of a semiconductor device in an eighth embodiment of the present invention after it has an inner wall oxidized.
Figure 12B:
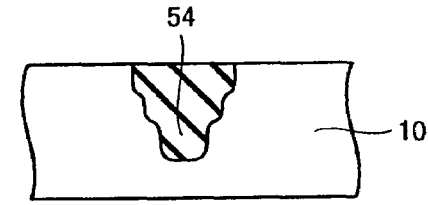
FIG. 12B is a cross section for illustrating a structure thereof after an interconnection process.
Figure 13:
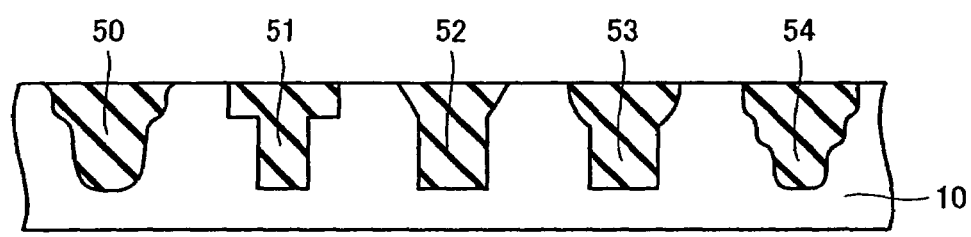
FIG. 13 is a schematic cross section for illustrating a structure of a semiconductor device using an application of the present invention.

Reference will now be made to FIGS. 12A and 12B to describe a method of fabricating a semiconductor device in an eighth embodiment of the present invention and a structure thereof. In the present embodiment, the FIGS. 1B-1D steps described in the first embodiment are repeated to form a 3-step trench 44 (FIG. 12A) which is in turn filled to provide a 3-step isolation film 54, as shown in FIG. 12B.

The present structure can achieve an effect similar to that of the first embodiment and furthermore provide a trench with a further gentle sidewall to prevent a junction from having defective leakage of electricity attributed to stress concentration.

Applications

As applications, trench isolation films 50-54 described in the above embodiments are provided to match requirements of each of adjacent elements, as will be described hereinafter. Trench isolation films 50-54 described in the embodiments can each have a configuration considered for example with withstand voltage, the level of microfabrication, the simplicity of the fabrication process taken into account and their configurations can be selected to satisfy requirements of adjacent elements. Furthermore, in each step of providing an isolation region, for example changing an etching condition, the presence/absence of the step of oxidizing an internal wall, the presence/absence of the step of providing a nitride film, and the like allow a single semiconductor device to have differently configured trench isolation films provided simultaneously, each for a different requirement. Thus trench isolation films satisfying requirements of adjacent elements can be provided by united steps to provide a more inexpensive and high-performance semiconductor device.

FIGS. 14A-16F show specific examples thereof. Herein is described a method of fabricating a non-volatile semiconductor memory device including a memory cell region having an isolation region provided with a trench isolation film of the present invention and peripheral circuitry region provided with a conventional trench isolation film.

First Application

Figure 14A:
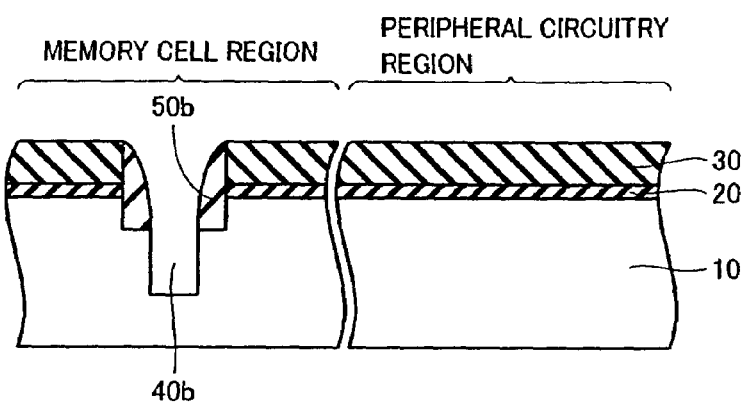
FIGS. 14A-14E are cross sections for illustrating a method of fabricating a semiconductor device in a first application of the present invention, and a structure thereof.
Figure 14B:
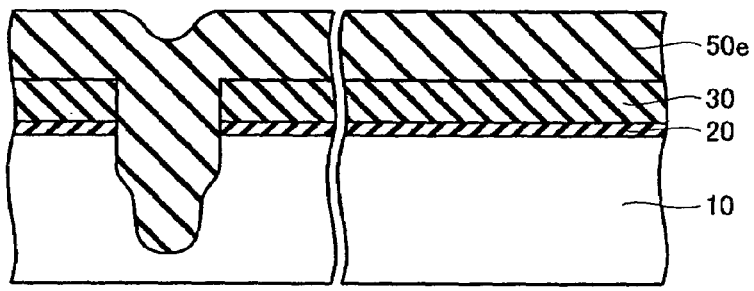
Figure 14C:
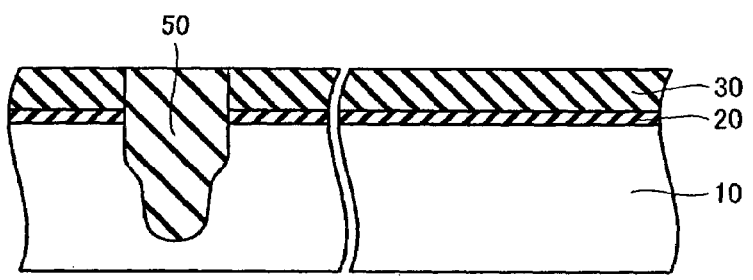
Figure 14D:
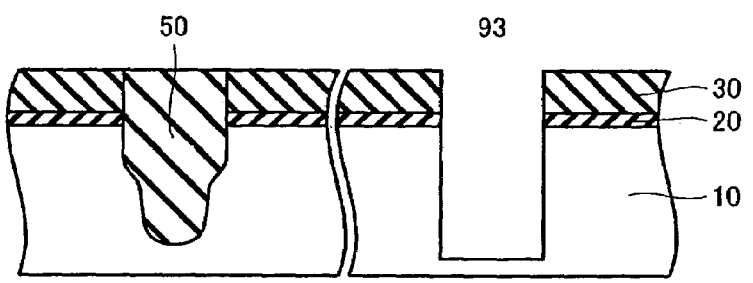
Figure 14E:
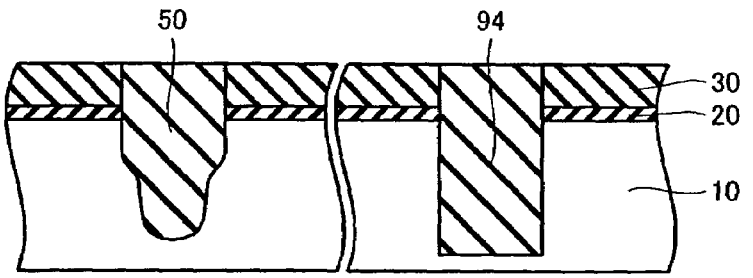

As a first application is considered a method shown in FIGS. 14A-14E. Initially, the method described in the first embodiment is employed to form a trench in the memory cell region (FIG. 14A). In this step, the memory cell region alone is patterned while the peripheral circuitry region is not patterned. Then, oxide film 50e is introduced, deposited (FIG. 14B) and it is chemically, mechanically polished and thus flattened until a surface of nitride film 30 is reached (FIG. 14C). Then the peripheral circuitry is patterned, etched to provide the peripheral circuitry region with a trench 93 (FIG. 14D) which is in turn filled with oxide film to provide a flat surface to obtain a conventional trench isolation 94 (FIG. 14E).

The present method allows simultaneous provision of an isolation film of the memory cell region required to be microfabricated and an isolation film of the peripheral circuitry region in particular required to have withstand voltage and leakage prevention characteristics. In particular, the present method allows the trench of the memory cell region and that of the peripheral circuitry to be formed simultaneously, each for a different requirement, and it can thus advantageously provide an increased degree of freedom in designing a structure, such as depth.

Second Application

Figure 15A:
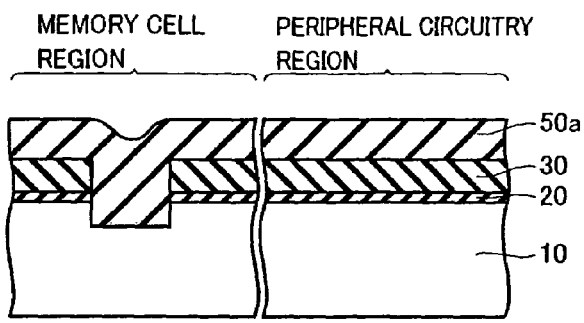
FIGS. 15A-15F are cross sections for illustrating a method of fabricating a semiconductor device in a second application of the present invention, and a structure thereof.
Figure 15B:
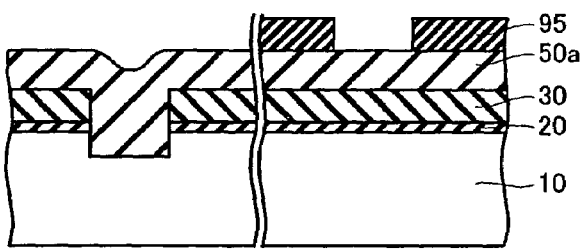
Figure 15C:
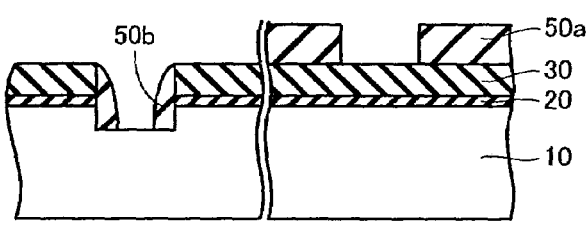

As a second application is considered a method shown in FIGS. 15A-15F. In the present method, as well as in the first application, the memory cell region alone is patterned to form an upper trench. The upper trench is then filled with insulation film 50a introduced therein (FIG. 15A). Subsequently, photoresist 95 is provided in the peripheral circuitry region on buried insulation film 50a (FIG. 15B) and then with photoresist 95 used as a mask, buried insulation film 50a is etched, and sidewall 50b is formed in the memory cell region and nitride film 30 is exposed in the peripheral circuitry region (FIG. 15C).

Figure 15D:
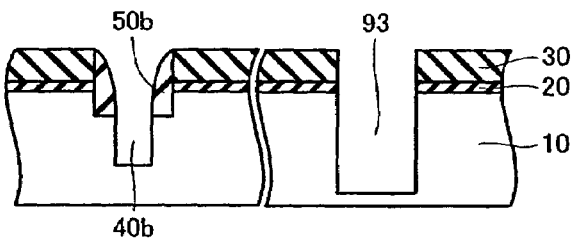
Figure 15E:
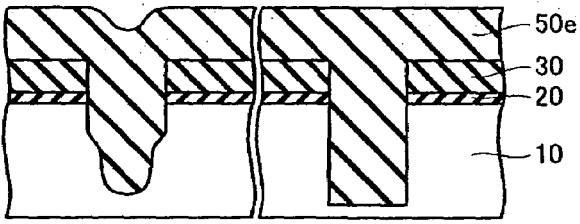
Figure 15F:
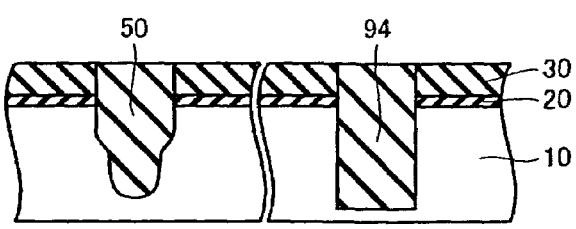

Furthermore, the intermediate product is dry-etched to form lower trench 40b in the memory cell region and normal trench 93 in the peripheral circuitry region (FIG. 15D). Then, buried oxide film 50e is provided (FIG. 15E), a surface is provided, and the memory cell region and the peripheral circuitry region are thus provided with trench isolation film 50 of the present invention and conventional trench isolation film 94, respectively (FIG. 15F).

The present method can provide the afore-mentioned isolation films each for a different requirement. Particularly in the present method the trench of the memory cell region and that of the peripheral circuitry region can be simultaneously formed to reduce the number of process steps. Furthermore in the present method a photoresist of the peripheral circuitry is deposited on a buried insulation film, which is particularly effective when such a severe etching condition is required as cannot be accommodated simply by the photoresist.

Third Application

Figure 16A:
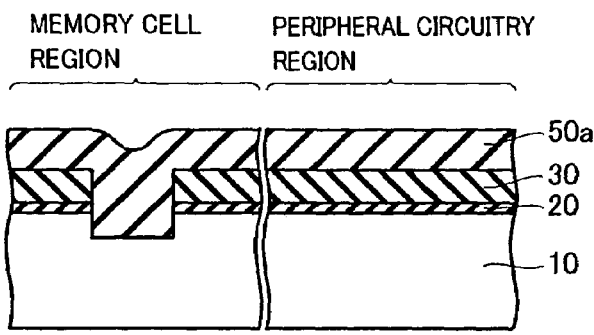
FIGS. 16A-16F are cross sections for illustrating a method of fabricating a semiconductor device in a third application of the present invention, and a structure thereof.
Figure 16B:
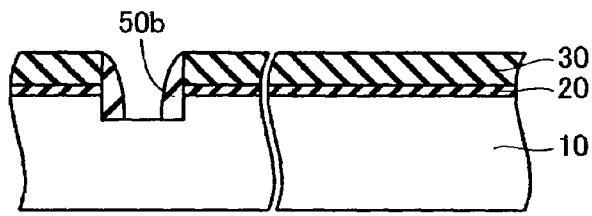
Figure 16C:
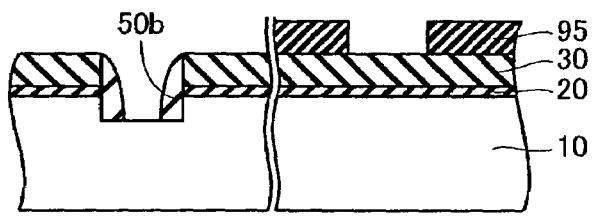
Figure 16D:
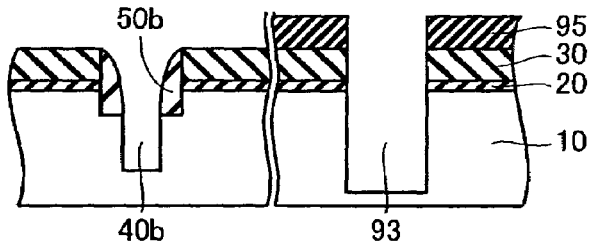
Figure 16E:
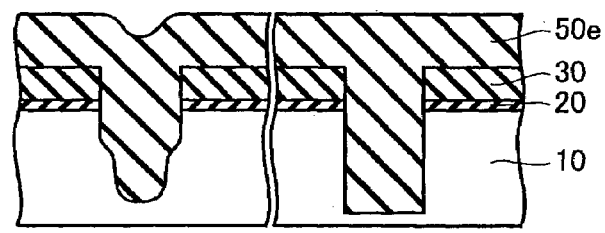

Furthermore as a third application is considered a method as shown in FIGS. 16A-16F. In the present method, as well as in the second application, the memory cell region alone is patterned to form an upper trench. The upper trench is then filled with insulation film 50a deposited therein (FIG. 16A) which is in turn etched to leave a portion of the buried oxide film in the upper trench to form sidewall 50b (FIG. 16B). Subsequently, photoresist 95 is provided in the peripheral circuitry region on nitride film 30 (FIG. 16C) and with photoresist 95 and sidewall 50b used as a mask the intermediate product is dry-etched to provide the peripheral circuitry region with normal trench 93 and the memory cell region with lower trench 40b (FIG. 16D).

Figure 16F:
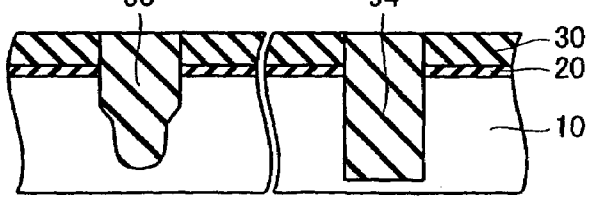

Then, as well as in the second application, filling oxide film 50e is introduced to provide a flat surface to provide the memory cell region with trench isolation film 50 of the present embodiment and the peripheral circuitry region with conventional trench isolation film 94 (FIG. 16F).

In the present method the afore-mentioned isolation films can be provided, each for a different requirement, and the number of process steps can also be reduced. Furthermore, the present method is more advantageous than the second application as the former can control a resist pattern in geometry better than the latter.

Note that while in each embodiment described above a method considered optimal for each step is exemplified to provide film, etch and the like, the present invention is not limited thereto and any technique resulting in the same configuration may be used to fabricate the semiconductor device.

Furthermore while in the above embodiments a trench isolation film has two steps or three steps, the present invention is not limited thereto and it is applicable to that with any number of steps. Furthermore while in the above embodiments, the upper trench alone is etched under a changed condition to have an oblique sidewall, a curved surface or the like by way of example, the lower trench can of course also be thus etched and formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a non-volatile semiconductor memory device comprising a semiconductor substrate having a main surface provided with an element region and an element isolation region arranged alternately in one direction, comprising the steps of:

forming an oxide film on said main surface of said semiconductor substrate to provide a tunnel oxide film;

forming a first recess at said main surface of said semiconductor substrate;

forming a second recess at a portion of a surface of said semiconductor substrate defining a bottom surface of said first recess;

filling said first and second recesses with an insulation film to form a trench isolation film to serve as said element isolation region adjacent said element region;

forming a polysilicon layer on said tunnel oxide film to provide a floating gate completely covering said element region in said direction; and forming a diffusion layer in said semiconductor substrate at said element region adjacent to said trench isolation film to extend from said main surface depthwise to reach a location deeper than said first recess and also be in contact with a side surface of said second recess.

2. The method of claim 1, wherein said diffusion layer is a source/drain region provided to sandwich the floating gate formed at said main surface.

3. A non-volatile semiconductor memory device comprising a semiconductor substrate having a main surface provided with an element region and an element isolation region arranged alternately in one direction, comprising:

a trench isolation film including a first recess formed at said main surface of said semiconductor substrate, a second recess formed at a portion of a surface of said semiconductor substrate defining a bottom surface of said first recess, and an insulation film filling said first and second recesses to serve as said element isolation region adjacent said element region;

a diffusion layer provided in said semiconductor substrate at said element region adjacent to said trench isolation film to extend from said main surface depthwise, said diffusion layer reaching a location deeper than said first recess and also in contact with a side surface of said second recess;

a tunnel oxide film on said semiconductor substrate at said element region adjacent to said first recess; and a floating gate on said tunnel oxide film and completely covering said element region in said direction.

4. The non-volatile semiconductor memory device of claim 3, wherein said diffusion layer is a source/drain region provided to sandwich the floating gate formed at said main surface.

* * * * *